(12) United States Patent
Kraus et al.

(10) Patent No.: US 11,226,357 B2
(45) Date of Patent: Jan. 18, 2022

(54) ELECTRICAL ARC DETECTION FOR ELECTRIC METER SOCKET CONNECTIONS

(71) Applicant: Landis+Gyr Innovations, Inc., Alpharetta, GA (US)

(72) Inventors: Matthew E. Kraus, Jamestown, IN (US); Frank J. Boudreau, Jr., Otterbein, IN (US)

(73) Assignee: LANDIS+GYR INNOVATIONS, INC., Alpharetta, GA (US)

( * ) Notice: Subject to any disclaimer, the term of this patent is extended or adjusted under 35 U.S.C. 154(b) by 160 days.

(21) Appl. No.: 16/586,200

(22) Filed: Sep. 27, 2019

(65) Prior Publication Data

US 2021/0096158 A1    Apr. 1, 2021

(51) Int. Cl.
| | |
|---|---|
| *G01R 9/04* | (2006.01) |
| *G01R 31/69* | (2020.01) |
| *H02H 1/00* | (2006.01) |

(52) U.S. Cl.
CPC .............. *G01R 9/04* (2013.01); *G01R 31/69* (2020.01); *H02H 1/0015* (2013.01)

(58) Field of Classification Search
CPC ...... G01R 9/04; G01R 31/69; G01R 31/1209; G01R 22/068; H02H 1/0015
USPC ......................................... 324/536, 512, 500
See application file for complete search history.

(56) References Cited

U.S. PATENT DOCUMENTS

| | | | |
|---|---|---|---|
| 5,949,235 A | 9/1999 | Castleman et al. | |
| 6,615,147 B1 | 9/2003 | Jonker et al. | |
| 6,816,360 B2 | 11/2004 | Brooksby et al. | |
| 7,135,850 B2 | 11/2006 | Ramirez | |
| 7,469,190 B2 | 12/2008 | Bickel | |
| 7,693,670 B2 | 4/2010 | Durling et al. | |
| 7,990,806 B2 | 8/2011 | Chen | |
| 8,004,933 B2 | 8/2011 | Iseli | |
| 8,121,741 B2 | 2/2012 | Taft et al. | |
| 8,223,466 B2 | 7/2012 | Roscoe | |
| 8,322,215 B2 | 12/2012 | Lakich et al. | |
| 8,326,554 B2 | 12/2012 | Caird | |
| 8,635,036 B2 | 1/2014 | Pamulaparthy et al. | |
| 8,754,634 B2 | 6/2014 | Chamarti et al. | |
| 8,830,083 B2 | 9/2014 | LaFrance et al. | |
| 8,854,217 B2 | 10/2014 | Brown et al. | |

(Continued)

FOREIGN PATENT DOCUMENTS

| | | |
|---|---|---|
| WO | 2018072030 | 4/2018 |
| WO | 2018083902 | 5/2018 |
| WO | 2019026791 | 2/2019 |

OTHER PUBLICATIONS

International Patent Application No. PCT/US2020/049153, International Search Report and Written Opinion, dated Nov. 13, 2020, 12 pages.

*Primary Examiner* — Giovanni Astacio-Oquendo
(74) *Attorney, Agent, or Firm* — Kilpatrick Townsend & Stockton LLP (57) ABSTRACT

A method for electrical arc detection in an electrical connection between an electric meter and a socket is provided. The method may include receiving a vibration signal from a vibration sensor and an arc detection signal from an arc detector. The vibration signal may be correlated in time with the arc detection signal. An electrical arc may be detected based on the correlating the vibration signal with the arc detection signal.

20 Claims, 5 Drawing Sheets

(56) References Cited

U.S. PATENT DOCUMENTS

| | | |
|---|---|---|
| 8,947,246 B2 | 2/2015 | Aiken |
| 8,978,443 B2 | 3/2015 | Ramirez |
| 8,996,144 B2 | 3/2015 | LaFrance et al. |
| 9,164,135 B2 | 10/2015 | Cs et al. |
| 9,304,014 B2 | 4/2016 | Komati et al. |
| 9,341,686 B2 | 5/2016 | Deak et al. |
| 9,476,740 B2 | 10/2016 | Zigovszki et al. |
| 9,557,392 B2 | 1/2017 | Schuhl et al. |
| 9,594,107 B1* | 3/2017 | Lawton ............... G01R 31/1227 |
| 9,602,895 B2 | 3/2017 | Bowling et al. |
| 9,671,254 B2 | 6/2017 | Zigovszki et al. |
| 9,887,051 B2 | 2/2018 | LaFrance et al. |
| 9,891,088 B2 | 2/2018 | Zigovszki et al. |
| 10,054,631 B2 | 8/2018 | Lawton et al. |
| 10,240,961 B2 | 3/2019 | Cheng et al. |
| 10,254,315 B2 | 4/2019 | Higashi et al. |
| 10,295,578 B2 | 5/2019 | Higashi et al. |
| 2014/0327449 A1 | 11/2014 | Shuey et al. |
| 2015/0070507 A1 | 3/2015 | Kagan |
| 2017/0082677 A1 | 3/2017 | Lawton et al. |
| 2018/0000538 A1* | 1/2018 | Schostek ............ A61B 18/1447 |
| 2018/0062373 A1 | 3/2018 | Whitehouse et al. |
| 2018/0073910 A1 | 3/2018 | Deak et al. |
| 2018/0106640 A1 | 4/2018 | Padrones et al. |
| 2019/0041439 A1 | 2/2019 | Brown |
| 2019/0094329 A1 | 3/2019 | Minich |
| 2019/0101411 A1 | 4/2019 | Davis et al. |
| 2019/0219618 A1 | 7/2019 | Davis et al. |
| 2019/0227105 A1* | 7/2019 | Minich ............... G01R 31/1272 |
| 2020/0328584 A1* | 10/2020 | Schegner ........... G01R 31/1272 |
| 2020/0358281 A1* | 11/2020 | Dickey ................. H02H 3/335 |
| 2021/0242675 A1* | 8/2021 | Busekrus ................ H01Q 1/50 |

* cited by examiner

ELECTRICAL ARC DETECTION FOR ELECTRIC METER SOCKET CONNECTIONS

BACKGROUND

Unless otherwise indicated herein, the materials described in this section are not prior art to the claims in this application and are not admitted to be prior art by inclusion in this section.

An electric meter measures electrical power consumed by a customer of an electric utility provider. The electric meter is plugged into a meter socket that is mounted in an enclosure on a building or other structure. The electrical connection between the electric meter and the socket is formed with a series of male connectors, sometimes referred to as "blades," which are received by a corresponding series of female connectors, also referred to as receptacles.

In some cases, for example, due to wear or contamination, the connection between the meter and the socket can become intermittent. A "hot socket" is a term used to describe the intermittent electrical connection between the blades of an electrical meter and the corresponding receptacles in the meter socket that results in electrical arcing at the connection. The electrical arcing can heat up the connection to the point of causing a fire. Hot socket conditions may be detected by detecting radio frequency (RF) signals that are generated by the socket arcing events. However, RF signals in the environment of the electric meter may be generated by other sources, for example as electromagnetic interference (EMI) from other nearby electrical equipment, causing false detection of a hot socket condition at the electric meter.

SUMMARY

Apparatuses and methods for electrical arc detection for electric meter socket connections are provided.

According to various aspects there is provided a method for electrical arc detection in an electrical connection between an electric meter and a socket. In some aspects, the method may include: receiving, by a processor of the electric meter, a vibration signal from a vibration sensor; receiving, by the processor, an arc detection signal from an arc detector; correlating in time, by the processor, the vibration signal with the arc detection signal; and determining, by the processor, that an electrical arc is detected based on the correlating the vibration signal with the arc detection signal. The determining that the electrical arc is detected may include determining that a correlation of the vibration signal with the arc detection signal is sustained for a predetermined period of time.

The vibration signal may include a first vibration signal. The first vibration signal is a low frequency vibration signal caused by a source external to the electric meter. The arc detection signal may be correlated to a portion of the first vibration signal having an amplitude exceeding a value necessary for the first vibration signal to sustain the electrical arc.

The vibration signal may include a second vibration signal. The second vibration signal may have a frequency different than a frequency of a power line signal. The second vibration signal may be caused by initiation and extinguishment of the electrical arc at zero crossings of the power line signal. The arc detection signal may be correlated to the second vibration signal.

The vibration signal may include a first vibration signal and a second vibration signal. The first vibration signal may be a low frequency vibration signal caused by a source external to the electric meter. The second vibration signal may have a frequency different than a frequency of a power line signal caused by initiation and extinguishment of the electrical arc at zero crossings of the power line signal. The arc detection signal may be correlated to a portion of the first vibration signal having an amplitude exceeding a value necessary for the first vibration signal to sustain the electrical arc and the second vibration signal.

The method may further include generating, by the processor, a notification that that the electrical arc is detected; and transmitting the notification to a utility provider.

According to various aspects there is provided an electric meter. In some aspects, the electric meter may include: an arc detector configured to detect radio frequency (RF) emissions generated by an electrical arc; a vibration sensor configured to detect vibrations; a communications module configured to transmit and receive communication signals; a memory configured to store executable instructions and data; and a processor in communication with the arc detector, the vibration sensor, the communications module, and the memory.

The processor configured to receive a vibration signal from the vibration sensor; receive an arc detection signal from the arc detector; correlate in time the vibration signal with the arc detection signal; and determine that the electrical arc is detected based on correlating the vibration signal with the arc detection signal. The processor may be further configured to determine that the electrical arc is detected by determining that a correlation of the vibration signal with the arc detection signal is sustained for a predetermined period of time.

The vibration sensor may be configured to detect a first vibration signal. The first vibration signal may be a low frequency vibration signal caused by a source external to the electric meter. The processor may be further configured to correlate the arc detection signal to a portion of the first vibration signal having an amplitude exceeding a value necessary for the first vibration signal to sustain the electrical arc.

The vibration sensor may be configured to detect a second vibration signal. The second vibration signal may have a frequency different than a frequency of a power line signal. The second vibration signal may be caused by initiation and extinguishment of the electrical arc at zero crossings of the power line signal. The processor may be further configured to correlate the arc detection signal to the second vibration signal.

The processor may be further configured to correlate the arc detection signal to a portion of a first vibration signal having an amplitude exceeding a value necessary for the first vibration signal to sustain the electrical arc and a second vibration signal. The first vibration signal may be a low frequency vibration signal caused by a source external to the electric meter. The second vibration signal may have a frequency different than a frequency of a power line signal caused by initiation and extinguishment of the electrical arc at zero crossings of the power line signal.

The processor may be further configured to generate a notification that the electrical arc is detected, and transmit the notification to a utility provider.

According to various aspects there is provided a non-transitory computer readable medium. In some aspects, the non-transitory computer readable medium may include instructions for causing one or more processors to perform operations including: receiving a vibration signal from a vibration sensor; receiving an arc detection signal from an arc detector; correlating in time the vibration signal with the arc detection signal; and determining that an electrical arc is detected based on the correlating the vibration signal with the arc detection signal.

The non-transitory computer readable medium may further include instruction for performing operations to determine that the electrical arc is detected including determining that a correlation of the vibration signal with the arc detection signal is sustained for a predetermined period of time.

Numerous benefits are achieved by way of the various embodiments over conventional techniques. For example, the various embodiments provide apparatuses and methods that can be used to reduce false alarms in the prediction of hot socket conditions for electric meter connections. In some embodiments, radio frequency (RF) signal detection correlated with vibration detection may increase the accuracy of detecting electrical arcs that cause hot socket conditions. These and other embodiments along with many of its advantages and features are described in more detail in conjunction with the text below and attached figures.

BRIEF DESCRIPTION OF THE DRAWINGS

Aspects and features of the various embodiments will be more apparent by describing examples with reference to the accompanying drawings, in which.

DETAILED DESCRIPTION

While certain embodiments are described, these embodiments are presented by way of example only, and are not intended to limit the scope of protection. The apparatuses, methods, and systems described herein may be embodied in a variety of other forms. Furthermore, various omissions, substitutions, and changes in the form of the example methods and systems described herein may be made without departing from the scope of protection.

Figure 1:
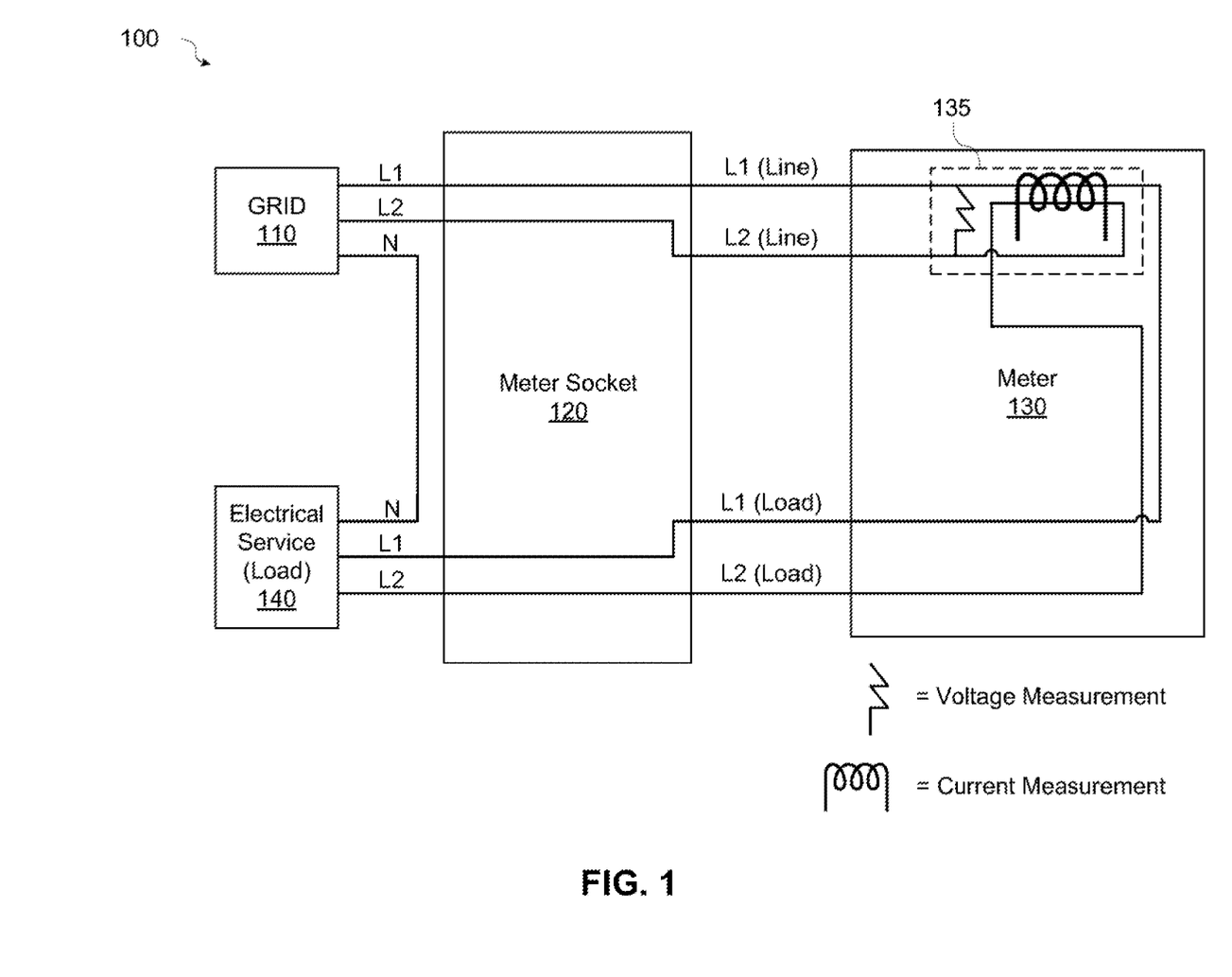
FIG. 1 is a block diagram illustrating electrical connections to an electric meter and meter socket according to some aspects of the present disclosure.

An electric meter measures electrical power consumed by a customer of an electric utility provider. The electric meter is plugged in to a meter socket that is mounted in an enclosure on a building or other structure and provides a connection between the electric power delivered by the electrical utility and the customer. FIG. 1 is a block diagram 100 illustrating electrical connections to an electric meter and meter socket according to some aspects of the present disclosure. The electric meter and meter socket are located at the customer premises. The electric meter measures and controls the electricity delivered to the customer premises via the grid. The electric meter may be combined with a communications module to enable the meter to communicate with other meters and with the utility.

As illustrated in FIG. 1, power from the grid 110 (i.e., the electrical distribution grid) is supplied to the meter socket 120 via electrical wiring L1 and L2. Electrical wiring L1 and L2 may provide power from two phases of the grid. The neutral wire N, sometimes referred to as ground, is connected between the grid 110 and the electrical service 140, for example, at an electrical service panel. In some cases, power may be provided from three phases of the grid, and appropriate wiring and connections (not shown) provided.

The electrical service 140 is also connected to the meter socket 120 via corresponding electrical wiring L1 and L2. The electric meter 130 includes an insulating base having electrical connectors to provide electrical connections to the meter socket 120. The meter socket 120 includes an insulating base having electrical connectors to provide electrical connections to the electric meter 130 when the electric meter 130 is plugged into the meter socket 120. An electrical connection between the grid 110 and the electrical service 140 is formed through the electric meter 130 when the electric meter 130 is plugged into the meter socket 120. Within the electric meter 130, voltage and current provided by the grid 110 to the electrical service 140 is measured, or metered, by measuring devices 135, for example, voltage transformers and current transformers. Power delivered to the electrical service 140 may be calculated based on the voltage and current measurements.

Figure 2:
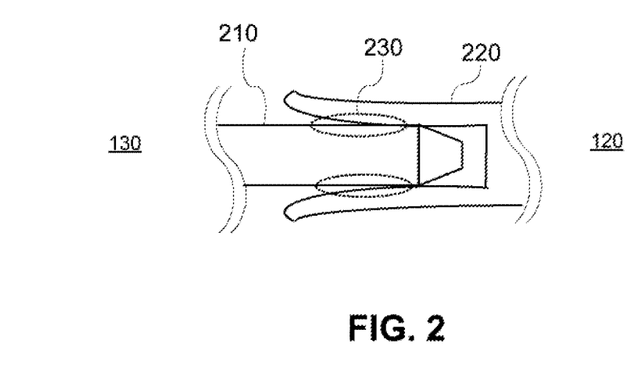
FIG. 2 is a diagram illustrating an example of an electrical connector for the electric meter and the meter socket according to some aspects of the present disclosure.

FIG. 2 is a diagram illustrating an example of an electrical connector for the electric meter and the meter socket according to some aspects of the present disclosure. Referring to FIG. 2, the electric meter 130 may include several male (e.g., blade) connectors 210 that mate with corresponding female connectors (e.g., receptacles) 220 in the meter socket 120. Spring tension of the female connectors 220 causes an interference fit between the male connectors 210 and the female connectors 220 to form the electrical connections between the electric meter 130 and the meter socket 120.

The interference fit (i.e., the mechanical strength of the connection) between the male contacts and the female contacts can become weak due, for example, to fatigue, wear from removal and insertion, improper insertion, contamination, etc. As the connections weaken, external vibrations caused by, for example nearby electrical machinery, passing vehicle traffic, etc., may cause small air gaps to form between the male contacts and the female contacts. Electrical arcs may occur across the air gaps in the areas 230 of the contacts to complete the electrical circuit. The electrical emissions caused by the arcing of the contacts are generated over a broad range frequencies, including RF frequencies, within the bandwidth that can be detected by an electrical arc detector.

A "hot socket" condition can result from an intermittent electrical connection between the blades of an electric meter and the corresponding receptacle in the meter socket. The intermittent connection can cause electrical arcing at the connection that can heat up the connection to the point of causing a fire. As the mechanical strength of the electrical connectors connecting the meter and the socket weaken, external sources of vibration, generally low frequency vibrations, for example less than about 50 Hz, can cause arcing due to a poor meter socket interface. External sources that create vibrations can be, for example, washer machines, air compressors, other nearby machinery, or vibrations propagated due to nearby traffic and transferred through structures.

Figure 3:
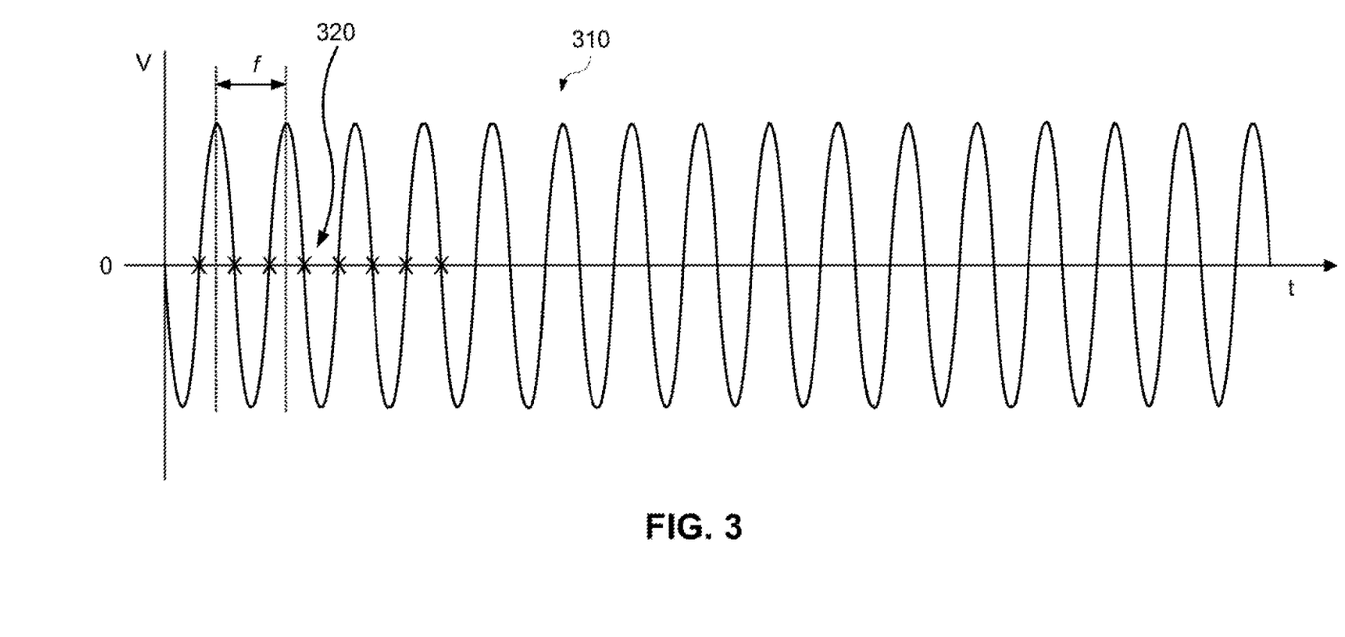
FIG. 3 is a diagram illustrating an example of an alternating current waveform showing the zero crossings according to aspects of the present disclosure.

The arcing caused by the intermittent connections at the socket can cause the arc between the electrical connectors to be created and then extinguished during the zero crossing of the alternating current (AC) power line waveform. This cycle of arc creation and extinguishment can create a vibration having a frequency different than the frequency of the power line. The created frequency may be harmonically related to the power line frequency and may be a sub-harmonic frequency or a higher harmonic frequency of the power line frequency. As an example, a frequency of twice the cycle of the power line frequency (since the current will become zero at two points during the cycle) may be created. For a 60 Hz system, the vibration may occur at 120 Hz. FIG. 3 is a diagram illustrating an example of an alternating current waveform showing the zero crossings according to aspects of the present disclosure.

Referring to FIG. 3, the AC waveform 310 may have a frequency $f$ equal to 60 Hz. The frequency of the AC waveform may be different in different parts of the world. For example, the power line frequency in some countries may be 50 Hz or another frequency. Regardless of the frequency, at the zero crossings 320 of the waveform the arc will be extinguished and reinitiated as the waveform passes the zero crossings 320. Since the zero crossings 320 occur twice during each cycle, the resulting vibration can have a frequency of twice the power line frequency. For example, for a 60 Hz power line frequency the resulting vibration will occur at 120 Hz; for a 50 Hz power line frequency the resulting vibration will occur at 100 Hz. As explained above, other vibration frequencies may be created as a result of the arcing.

Arcing conditions between the contacts of the electric meter and the meter socket may be detected using an arc detector designed to detect radio frequency (RF) signals that are generated by the socket arcing events. An electrical contact arc detector may be a broadband detector circuit installed within close proximity of the electric meter blade connectors to detect signal generated by the contact arcing. The detector may operate over a range of frequencies in the RF band. A minimum threshold signal amplitude may be established below which the detector does not respond and above which the detector produces a detection signal at its output to indicate an occurrence of electrical arcing. The electrical contact arc detector can be susceptible to false detection of arcing conditions by detecting RF signals generated by other electromagnetic interference (EMI) sources, for example nearby electrical equipment, citizen band (CB) radios, etc.

In accordance with aspects of the present disclosure, apparatuses and methods for electrical arc detection for electric meter socket connections are provided. Some implementations may correlate EMI event detected by an arc detector with low frequency vibrations generated by sources external to the electric meter. In some implementations a vibration frequency occurring at twice the frequency of the power line due to arc creation and extinguishment may be detected to reduce false positive detections. In some cases, the created frequency and may be a sub-harmonic frequency or higher harmonic frequency of the power line frequency.

Figure 4:
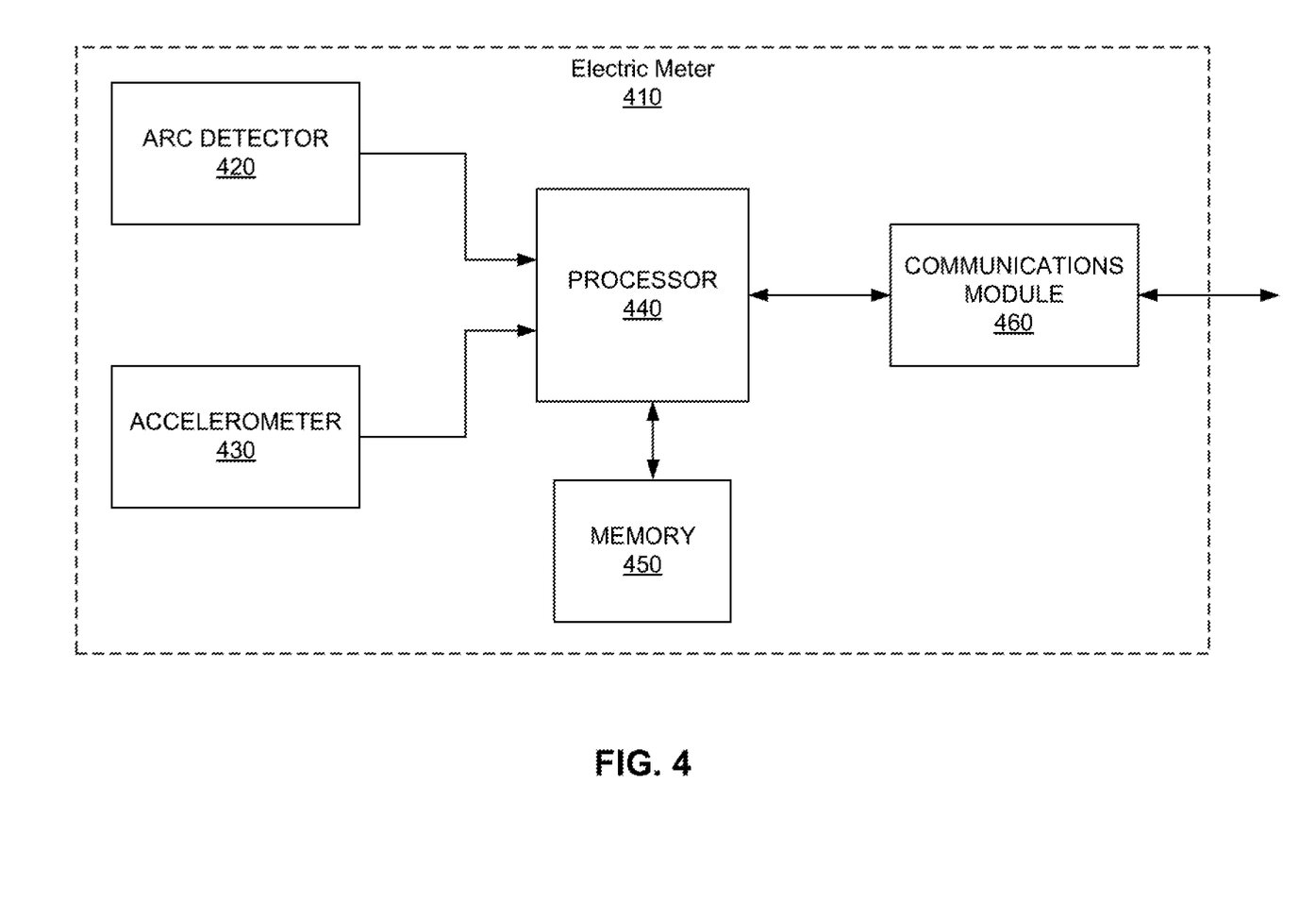
FIG. 4 is a block diagram illustrating an example implementation of an electrical arc detection circuit in an electric meter according to aspects of the present disclosure.

FIG. 4 is a block diagram illustrating an example implementation of an electrical arc detection circuit in an electric meter according to aspects of the present disclosure. Referring to FIG. 4, the electric meter 410 may include an arc detector 420, an accelerometer 430, a processor 440, a memory 450, and a communications module 460.

The arc detector 420 may be a broadband detector capable of detecting frequencies above a specified amplitude in a range of frequencies in the RF band that are generated by an electrical arc. The arc detector 420 may produce a detection signal at its output to indicate an occurrence of electrical arcing.

The accelerometer 430 may be a 2-axis accelerometer, a 3-axis accelerometer, an omnidirectional tilt and vibration sensor, or other accelerometer or seismic sensor capable of detecting vibrations. The accelerometer may be operable to detect vibrations in a range of several hertz to several hundred hertz. Thus, the accelerometer 430 may detect low frequency vibrations caused by external sources and vibrations generated by initiation and extinguishment of arcs at the electric meter connections.

The communications module 460 may be a wired or wireless transceiver operable to communicate via various wired or wireless protocols as known in the field. The communications module 460 may enable the electric meter 410 to communicate with other meters and with the utility provider. The communications module 460 may transmit data and alarm signals to the utility provider and receive any of updated program instructions, firmware updates, updates to other settings, or other communications.

The memory 450 may be a storage device such as a solid state storage device or other storage device, and may be a combination of volatile and non-volatile storage or memory. In some implementations, portions of the memory may be included in the processor 440. The memory 450 may be configured to store instructions executable by the processor 440 as well as data generated by various sensors of the electric meter 410 including, but not limited to, data generated by the arc detector 420 and the accelerometer 430.

The processor 440 may be a general purpose processor, a digital signal processor (DSP), an application specific integrated circuit (ASIC), a field programmable gate array (FPGA) or other programmable logic device. The processor 440 may be in electrical communication with the arc detector 420, the accelerometer 430, the memory 450, and the communications module 460, and may control overall operation of the electric meter 410. The processor 440 may receive data generated by various sensors of the electric meter 410 including, but not limited to, data generated by the arc detector 420 and the accelerometer 430 and may perform operations on, or processing of, the data. In some implementations, the data generated by the arc detector 420 and the accelerometer 430 may be timestamped by the arc detector 420 and the accelerometer 430, respectively. In some implementations, the data generated by the arc detector 420 and the accelerometer 430 may be timestamped by the processor 440. In some implementations, the accelerometer data and the arc detector data may not include a timestamp.

In accordance with aspects of the present disclosure, when the electric meter 410 is installed in a meter socket, the accelerometer 430 may monitor vibrations, for example low frequency vibrations caused by external sources, experienced by the electric meter 410. The processor 440 may receive timestamped data from the accelerometer 430 or may receive and timestamp the accelerometer data. In some implementations, the processor 440 may cause the timestamped accelerometer data to be stored, for example in the memory 450 or other storage. The accelerometer data may be stored for a specified period of time, for example 10 seconds or another period of time.

Low frequency vibration may cause arcing at the connector. The arc may be initiated when the amplitude of the low frequency vibration reaches a sufficient value to cause an air gap at the connector and the arc may be extinguished when the magnitude of the vibration falls below the magnitude sufficient to maintain the air gap. The external vibration and the resulting arcing may be detected by the accelerometer 430 and the arc detector 420, respectively.

Figure 5:
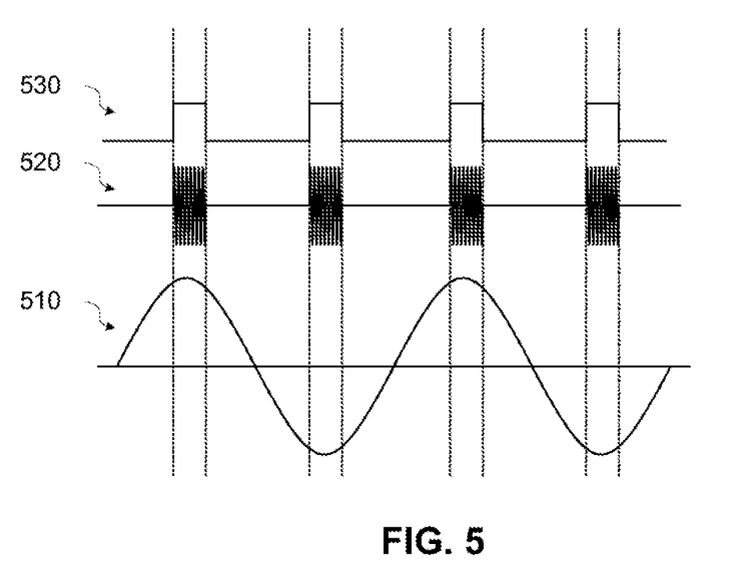
FIG. 5 is a diagram illustrating an example of a correlation between an external vibration waveform, a vibration waveform caused by connector arcing, and an arc detection signal according to aspects of the present disclosure.

FIG. 5 is a diagram illustrating an example of a correlation between an external vibration waveform, a vibration waveform caused by connector arcing, and an arc detection signal according to aspects of the present disclosure. Referring to FIG. 5, a low frequency external vibration signal 510 may be detected by the accelerometer 430. The low frequency external vibration signal 510 may be cause by, for example, but not limited to, washer machines, air compressors, other nearby machinery, or vibrations propagated due to nearby traffic and transferred through structures. When the amplitude of the low frequency vibrations becomes high enough, the low frequency vibrations can cause intermittent connections between the meter and the socket resulting in arcing at the electrical connection between the blades of an electrical meter and the corresponding receptacle in the meter socket. The intermittent connections at the socket can also cause vibrations 520 as the arc is created and then extinguished during the zero crossings of the alternating current (AC) power line waveform, that is, at twice the power line frequency since there are two zero crossings during each cycle. In some cases, the created frequency and may be a sub-harmonic frequency or higher harmonic frequency of the power line frequency. The arc detector 420 may detect the RF signals emitted by the arcing and generate a detection signal 530 corresponding to the arcing condition.

For each half-cycle of the low frequency vibration signal 510, the amplitude may be high enough during a portion of the half-cycle to cause arcing at the connector. During that portion of the half-cycle, the arc will initiate and extinguish as the amplitude of the current waveform at the power line frequency exceeds and falls below a value needed to sustain the arc. The power line frequency (e.g., at 50 Hz or 60 Hz) can be much higher than the low frequency vibration signal 510 that initially causes the arcing; therefore, the high frequency arcing will occur twice during the full cycle of the low frequency vibration—once during the portion of each half-cycle of the low frequency vibration that causes the arcing. Thus, during those portions of the low frequency vibration signal 510, arcing at twice the power line frequency (e.g., 120 Hz for a 60 Hz power line frequency, 100 Hz for a 50 Hz power line frequency) will occur cyclically based on the frequency of the low frequency vibration. The RF emissions caused by the arcing can be detected by the arc detector 420. The arc detection signal 530 may be generated at twice the external low frequency 510 corresponding to the portion of the low frequency vibration signal 510 that causes the arcing condition. In some cases, the frequency created by the arcing may be harmonically related to the power line frequency and may be a sub-harmonic frequency or a higher harmonic frequency of the power line frequency. In some cases, the arcing may occur one or more times during several cycles of the low frequency vibration.

The processor 440 can correlate the arc detection signal 530 with the external vibration 510 detected by the accelerometer 430. Additionally, since the external vibration 510 will be at a lower frequency than the vibration signal 520 caused by the arcing, several cycles of the arcing vibration signal 520 may occur during each half cycle of the external vibration 510 when the amplitude of the external vibration 510 exceeds a value to cause arcing of the connector.

As illustrated in FIG. 5, the substantially periodic external vibration 510 may cause cyclic arcing at twice the frequency of the vibration 510 caused by the external source or at another frequency. Thus, a cyclically sustained RF and vibration signature can result and can be detected over a period of time, for example, 10 seconds or another time period, to determine the occurrence of a hot socket condition.

The processor 440 can correlate the frequency of the vibration detected by the accelerometer 430 with the frequency of the arc detection signal generated by the arc detector 420 during a same time period and determine that arcing is occurring. When the cyclical arcing correlated with the external vibration is sustained for a specified period of time, for example, 10 seconds or another period of time, the processor 440 may determine that a hot socket condition exists and transmit a notification via the communications module 460 to the utility provider. The correlation of vibration with the arc detection signal can reduce incidents of false detections caused by external EMI sources when only an arc detector is used for detecting a hot socket condition.

Additionally, within the low frequency vibration, the higher frequency vibration at twice the power line frequency caused by the arc being initiated and extinguished at the zero crossings may be detected by the accelerometer 430. Thus, vibration at twice the power line frequency may be detected within each portion of the low frequency vibration having sufficient amplitude to cause arcing. Detection of the vibration at twice the power line frequency can further increase the accuracy of the connector arcing determination. In some cases, the vibration frequency created by the arcing may be harmonically related to the power line frequency and may be a sub-harmonic frequency or a higher harmonic frequency of the power line frequency.

One of ordinary skill in the art will appreciate that these configuration as well as other variations of the disclosed configurations may be used without departing from the scope of the present disclosure.

Figure 6:
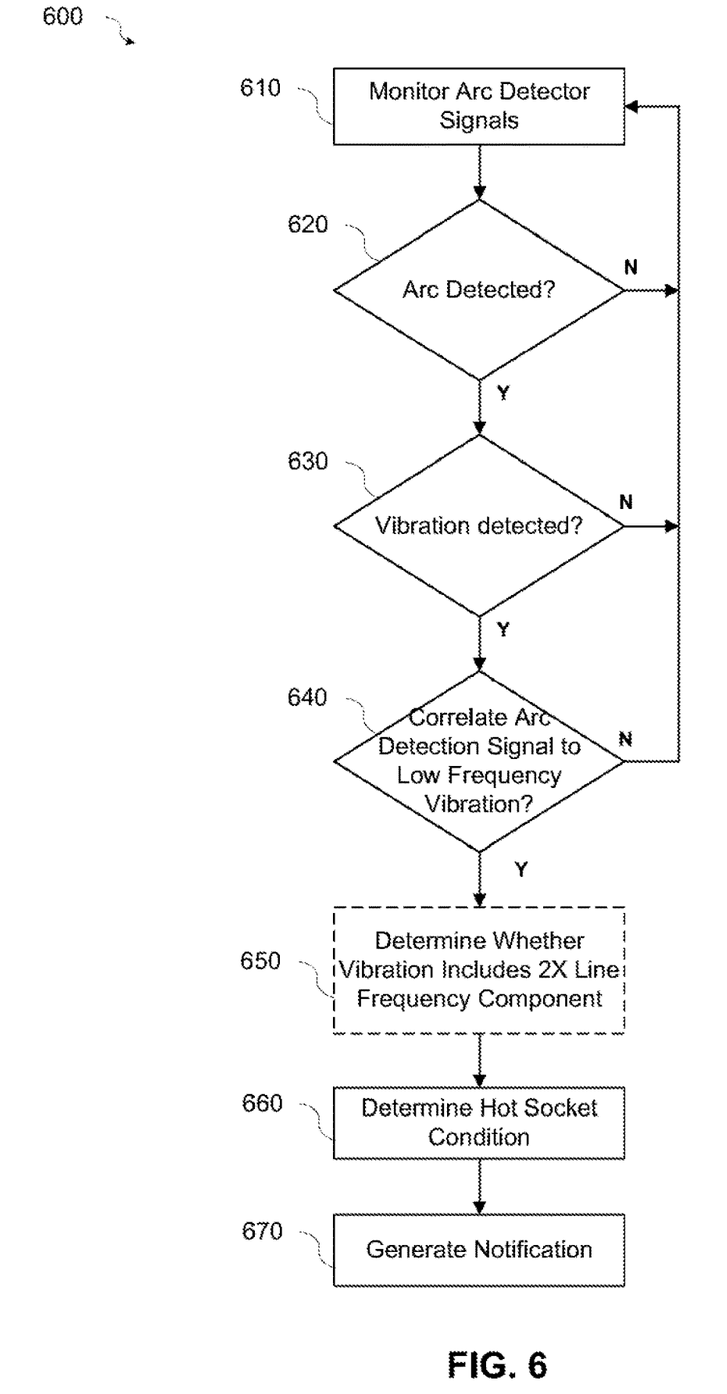
FIG. 6 is a flowchart illustrating an example of a method for electrical arc detection for electric meter socket connections according to aspects of the present disclosure.

FIG. 6 is a flowchart illustrating an example of a method 600 for electrical arc detection for electric meter socket connections according to aspects of the present disclosure. Referring to FIG. 6, at block 610, signals from the arc detector may be monitored. The processor (e.g., the processor 440) may be in electrical communication with the arc detector (e.g., the arc detector 420) to receive arc detection signals generated by the arc detector.

At block 620, it may be determined whether an arc is detected by the arc detector. The processor may execute instructions to determine whether an arc detection signal received from the arc detector indicates occurrence of an arc. For example, the processor may determine whether an arc detection signal received from the arc detector exceeds a predetermined threshold value.

In response to determining that an arc has not been detected, for example the arc detection signal received from the arc detector does not exceed a predetermined threshold value (620-N), the process may continue to monitor for signals from the arc detector at block 610.

In response to determining that an arc has been detected, for example the arc detection signal received from the arc detector exceeds a predetermined threshold value (620-Y), at block 630, it may be determined whether vibrations are detected. The processor may be in electrical communication with the accelerometer (e.g., the accelerometer 430) and may execute instructions to process signals received from the accelerometer.

In response to determining that vibrations have not been detected, for example the vibration signal received from the accelerometer does not exceed a predetermined threshold value (630-N), the processor may determine that the arc detection signal was caused by external EMI sources, for example nearby electrical equipment, citizen band (CB) radios, etc., and may cause the process to continue to monitor for signals from the arc detector at block 610.

In response to determining that vibrations have been detected, for example the vibration signal received from the accelerometer exceeds a predetermined threshold value (630-Y), at block 640, it may be determined whether the vibrations can be correlated to the arc detection signal. The processor may execute instructions to process the signals received from the accelerometer. For example, the processor may process the accelerometer signals using a comb filter, fast Fourier transform (FFT) analysis, or another method, to determine the frequency content. The processor can determine a low frequency content of the accelerometer signals that may correspond to vibrations caused by external sources such as nearby machinery, or vibrations propagated due to nearby traffic and transferred through structures. The external sources of low frequency vibrations may initiate arcing in the meter socket.

The processor may execute instructions to correlate the low frequency vibrations with the arc detection signals. For example, the processor may continue to receive arc detection signals and accelerometer signals in real time or near real time and determine whether the arc detection signals correspond to portions of the accelerometer signals in a cyclical manner, for example as shown in FIG. 5. In some implementations, the processor may store and subsequently process time stamped arc detection and accelerometer signals.

In response to determining that the vibrations are not correlated to the arc detection signal (640-N), the process may continue to monitor for signals from the arc detector at block 610.

In response to determining that the vibrations are correlated to the arc detection signal (640-Y), at optional block 650, it may be determined whether the vibrations include vibrations at a frequency approximately equal to twice the power line frequency. The processor may optionally execute instructions to determine if the frequency content of the accelerometer signals includes a frequency approximately equal to twice the power line frequency. A frequency approximately equal to twice the power line frequency included in the accelerometer signals can indicate a cycle of arc creation and destruction creating a vibration at twice the power line frequency. For example, for a 60 Hz system, the vibration may occur at 120 Hz. Optional detection of a frequency approximately equal to twice the power line frequency can increase the probability that an actual hot socket condition has been detected. It should be appreciated that the vibrations correlated to the arc detection signal may be harmonically related to the power line frequency and may be a sub-harmonic frequency or a higher harmonic frequency of the power line frequency.

At block 660, it may be determined that a hot socket condition exists. The processor may execute instructions to determine that a cyclically sustained arc detector signal is correlated in time to a vibration signature over a period of time, for example, 10 seconds or another time period, to determine the occurrence of a hot socket condition. For example, referring to FIG. 5, the low frequency vibration signal 510 and the arc detection signal 530 may be correlated over time to determine that a hot socket (e.g., arcing) condition exists at the connection between the electric meter and meter socket. In some implementations, the vibration signal 520 caused by arcing at the connector may additionally or alternatively be correlated with the arc detection signal to determine that a hot socket condition exists.

At block 670, a notification may be generated. Based on the determination that a hot socket condition exists, the processor may generate an notification. For example, the processor may execute instructions to communicate (e.g., via the communications module 460) a notification to a central system that a hot socket condition exists in the connection between the electric meter and the meter socket. The notification may be communicated wirelessly or via a wired communication link to a central system of a utility provider. In some implementation, when it is determined that a hot socket condition exists, the processor may generate a signal to cause a power switch (not shown) to disconnect the power line from the building.

It should be appreciated that the specific operations illustrated in FIG. 6 provide a particular method for electrical arc detection for electric meter socket connections according to an embodiment of the present invention. Other sequences of operations may also be performed according to alternative embodiments. For example, alternative embodiments of the present invention may perform the operations outlined above in a different order. Moreover, the individual operations illustrated in FIG. 6 may include multiple sub-operations that may be performed in various sequences as appropriate to the individual operation. Furthermore, additional operations may be added or removed depending on the particular applications. One of ordinary skill in the art would recognize many variations, modifications, and alternatives.

The method 600, may be embodied on a non-transitory computer readable medium, for example, but not limited to, the memory 450 or other non-transitory computer readable medium known to those of skill in the art, having stored therein a program including computer executable instructions for making a processor, computer, or other programmable device execute the operations of the methods.

In accordance with aspects of the present disclosure, a library of arc detection/vibration signatures may be compiled. For example, the processor of the electric meter may cause signatures of correlated vibration and arc detection signals resulting in hot socket detections to be stored, for example in the memory 450, and transmitted to a central system of a utility provider for storage in a central library, for example on a server of the utility provider. In some implementations, the signatures collected and stored in the memory of the electric meter may be compared with newly obtained vibration and arc detection signals to determine a hot socket condition. In some implementations, newly obtained vibration and arc detection signals may be transmitted to the central system of the utility provider and compared with the signatures stored in the central library to determine a hot socket condition. In some implementations, signatures may be downloaded from the central library and stored in the memory of the electric meter.

The examples and embodiments described herein are for illustrative purposes only. Various modifications or changes in light thereof will be apparent to persons skilled in the art. These are to be included within the spirit and purview of this application, and the scope of the appended claims, which follow.

What is claimed is:

1. A method for electrical arc detection in an electrical connection between an electric meter and a socket, the method comprising:

receiving, by a processor of the electric meter, a vibration signal from a vibration sensor, wherein the vibration signal is generated based on a mechanical vibration source external to the electric meter;

receiving, by the processor, an arc detection signal from an arc detector;
correlating in time, by the processor, the vibration signal with the arc detection signal; and
determining, by the processor, that an electrical arc is detected based on the correlating of the vibration signal with the arc detection signal.

2. The method of claim 1, wherein the determining that the electrical arc is detected comprises determining that a correlation of the vibration signal with the arc detection signal is sustained for a predetermined period of time.

3. The method of claim 1, wherein the vibration signal includes a first vibration signal,
wherein the first vibration signal is a low frequency vibration signal caused by a mechanical source external to the electric meter.

4. The method of claim 3, wherein the arc detection signal is correlated to a portion of the first vibration signal having an amplitude exceeding a value necessary for the first vibration signal to sustain the electrical arc.

5. The method of claim 1, wherein the vibration signal includes a second vibration signal,
wherein the second vibration signal has a frequency different than a frequency of a power line signal.

6. The method of claim 5, wherein the second vibration signal is caused by initiation and extinguishment of the electrical arc at zero crossings of the power line signal.

7. The method of claim 5, wherein the arc detection signal is correlated to the second vibration signal.

8. The method of claim 1, wherein:
the vibration signal comprises a first vibration signal and a second vibration signal,
the first vibration signal is a low frequency vibration signal caused by the mechanical vibration source external to the electric meter;
the second vibration signal has a frequency different than a frequency of a power line signal caused by initiation and extinguishment of the electrical arc at zero crossings of the power line signal; and
the arc detection signal is correlated to a portion of the first vibration signal having an amplitude exceeding a value necessary for the first vibration signal to sustain the electrical arc and to the second vibration signal.

9. The method of claim 1, further comprising:
generating, by the processor, a notification that the electrical arc is detected; and
transmitting the notification to a utility provider.

10. An electric meter, comprising:
an arc detector configured to detect radio frequency (RF) emissions generated by an electrical arc;
a vibration sensor configured to detect vibrations;
a communications module configured to transmit and receive communication signals;
a memory configured to store executable instructions and data; and
a processor in communication with the arc detector, the vibration sensor, the communications module, and the memory, the processor configured to:
receive a vibration signal from the vibration sensor wherein the vibration signal is generated based on a mechanical vibration source external to the electric meter;
receive an arc detection signal from the arc detector;
correlate in time the vibration signal with the arc detection signal; and
determine that the electrical arc is detected based on correlating the vibration signal with the arc detection signal.

11. The electric meter of claim 10, wherein the processor is further configured to determine that the electrical arc is detected by determining that a correlation of the vibration signal with the arc detection signal is sustained for a predetermined period of time.

12. The electric meter of claim 10, wherein the vibration sensor is configured to detect a first vibration signal, wherein the first vibration signal is a low frequency vibration signal caused by a mechanical source external to the electric meter.

13. The electric meter of claim 12, wherein the processor is further configured to correlate the arc detection signal to a portion of the first vibration signal having an amplitude exceeding a value necessary for the first vibration signal to sustain the electrical arc.

14. The electric meter of claim 10, wherein the vibration sensor is configured to detect a second vibration signal, wherein the second vibration signal has a frequency different than a frequency of a power line signal.

15. The electric meter of claim 14, wherein the second vibration signal is caused by initiation and extinguishment of the electrical arc at zero crossings of the power line signal.

16. The electric meter of claim 14, wherein the processor is further configured to correlate the arc detection signal to the second vibration signal.

17. The electric meter of claim 10, wherein the processor is further configured to correlate the arc detection signal to a portion of a first vibration signal having an amplitude exceeding a value necessary for the first vibration signal to sustain the electrical arc and to a second vibration signal,
wherein the first vibration signal is a low frequency vibration signal caused by the mechanical vibration source external to the electric meter, and
the second vibration signal has a frequency different than a frequency of a power line signal caused by initiation and extinguishment of the electrical arc at zero crossings of the power line signal.

18. The electric meter of claim 10, wherein the processor is further configured to generate a notification that the electrical arc is detected; and
transmit the notification to a utility provider.

19. A non-transitory computer readable medium having stored therein instructions for making one or more processors execute a method for electrical arc detection in an electrical connection between an electric meter and a socket, the processor executable instructions comprising instructions for performing operations including:
receiving a vibration signal from a vibration sensor;
receiving an arc detection signal from an arc detector;
correlating in time the vibration signal with the arc detection signal; and
determining that an electrical arc is detected based on the correlating of the vibration signal with the arc detection signal,
wherein the vibration signal comprises:
a low frequency vibration signal caused by a mechanical source external to the electric meter, and
a frequency different than a frequency of a power line signal caused by initiation and extinguishment of the electrical arc at zero crossings of the power line signal.

20. The non-transitory computer readable medium as defined in claim 19, further comprising instruction for performing operations including:

determining that the electrical arc is detected comprises determining that a correlation of the vibration signal with the arc detection signal is sustained for a predetermined period of time.

* * * * *